United States Patent
Kim (10) Patent No.: US 6,469,539 B2
(45) Date of Patent: Oct. 22, 2002

(54) IMPEDANCE CONTROLLED OUTPUT CIRCUIT HAVING MULTI-STAGE OF HIGH CODE SELECTORS IN SEMICONDUCTOR DEVICE AND METHOD FOR OPERATING THE SAME

(75) Inventor: Young-tae Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/845,846

(22) Filed: Apr. 30, 2001

(65) Prior Publication Data

US 2002/0057102 A1 May 16, 2002

(30) Foreign Application Priority Data

Nov. 15, 2000 (KR) ........................................ 2000-67627

(51) Int. Cl.$^7$ .......................................... H03K 19/0185
(52) U.S. Cl. ............................. 326/30; 326/86; 326/90; 327/108; 327/175; 710/101
(58) Field of Search .............................. 326/30, 83, 86; 327/108, 175, 134, 170

(56) References Cited

U.S. PATENT DOCUMENTS

| | | |
|---|---|---|
| 5,095,231 A | 3/1992 | Sartori et al. |
| 5,153,450 A | 10/1992 | Ruetz |
| 5,206,544 A | 4/1993 | Chen et al. |
| 5,319,258 A | 6/1994 | Ruetz |
| 5,666,078 A | 9/1997 | Lamphier et al. |
| 5,703,496 A | 12/1997 | Sabin |
| 5,751,161 A * | 5/1998 | Wei et al. ...................... 326/30 |
| 5,804,998 A | 9/1998 | Cahill et al. |
| 5,949,272 A | 9/1999 | Bickford et al. |
| 6,118,310 A * | 9/2000 | Esoh, Jr. ...................... 327/108 |
| 6,204,683 B1 * | 3/2001 | Falconer ....................... 326/30 |
| 6,292,014 B1 * | 9/2001 | Hedberg ....................... 326/30 |

* cited by examiner

Primary Examiner—Michael Tokar
Assistant Examiner—Vibol Tan
(74) Attorney, Agent, or Firm—F. Chau & Associates, LLP (57) ABSTRACT

A semiconductor device (such as a semiconductor memory device) having a mechanism for providing a stable output impedance, controlling impedance matching and for preventing vibration of a turn-on impedance of an off chip driver. In one aspect, a circuit for controlling the impedance for a semiconductor device comprises a control code selecting circuit comprising a plurality cascade-connected stages of code selecting sections, wherein the control code selecting circuit is configured for outputting a constant control code. The multi-stage high code selecting section is preferably connected between a counter and an impedance driver, and is configured for preventing vibration of the turn-on impedance of an off chip driver.

20 Claims, 7 Drawing Sheets

IMPEDANCE CONTROLLED OUTPUT CIRCUIT HAVING MULTI-STAGE OF HIGH CODE SELECTORS IN SEMICONDUCTOR DEVICE AND METHOD FOR OPERATING THE SAME

BACKGROUND

1. Technical Field

The present invention relates to a semiconductor device and, more particularly, to a semiconductor device having an impedance controlled output circuit that comprises a mechanism for controlling fluctuation in the turn-on impedance of an output driver to obtain a stable output impedance.

2. Discussion of Related Art

Various semiconductor devices such as microcomputers, memories and gate arrays, etc., are integrated within personal computers and other electrical products such as workstations. Typically, such semiconductor devices comprise an input/output (I/O) pin for inputting data transmitted from another device and an output circuit (e.g., output buffer and driver circuit) for outputting data to another device. When the semiconductor device is integrated within an electrical product, the I/O pin is typically connected to a transmission line that comprises printed wiring on a mounting substrate, for example. The transmission line may act as an interface between one or more semiconductor devices for transmitting data. To achieve optimal data transmission over the transmission line, there should be a match between the output impedance of the I/O pin and the impedance of the transmission line.

The wavelength of signals interfaced between semiconductors is becoming increasingly smaller so as to obtain higher operating speeds and minimize signal transfer delay time. As the wavelength decreases, however, exterior noise interference and reflection of an output signal based on an impedance miss matching in an interface terminal become critical factors in signal transmission. Impedance miss matching is caused by various factors such as external noise, a transformation of power voltage, a change of operation temperature and a change of a fabricating process, etc. If impedance miss matching occurs, high-speed transmission of data is difficult and data comprising an output signal outputted from a data-outputting terminal of a semiconductor device may be distorted. When a semiconductor device receives the distorted output signal, various problems may be encountered such as set-up/hold fail or a failure to detect a requisite input level, etc.

Figure 1:
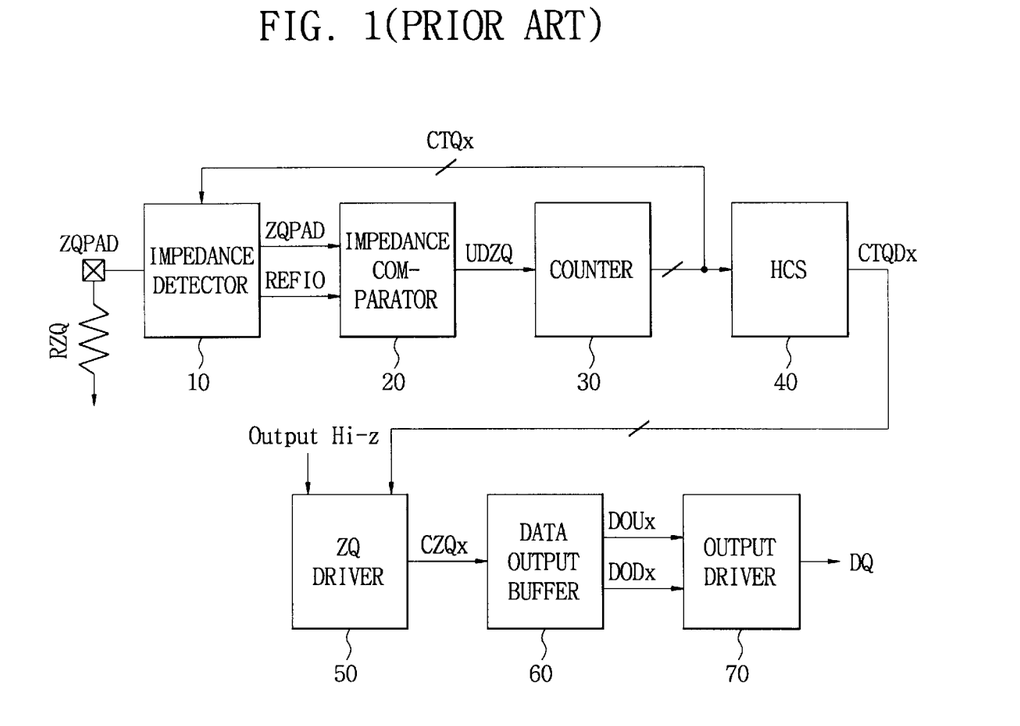
FIG. 1 is a block diagram of a conventional impedance control output circuit.

To combat these problems, semiconductor memory devices have implemented variable impedance control schemes (having an architecture shown in FIG. 1 for example) to provide impedance matching. More specifically, FIG. 1 illustrates a high-level block diagram of a conventional variable impedance control and output circuit (which as explained below is modified to provide a control mechanism in accordance with the present invention). The variable impedance control circuit comprises an impedance detector 10, an impedance comparator 20, a counter 30, a high code selector (HCS) 40 and a ZQ (impedance) driver 50. The output circuit comprises a data output buffer 60 and an off chip driver 70 as an output driver.

By way of example, in a high-speed transceiver logic (HSTL) interface, the system of FIG. 1 is typically utilized for impedance control so as to obtain a desired output impedance within approximately several tens of ohms specifications by using one extra pin. More specifically, assuming a HSTL interface is implemented with the impedance control system of FIG. 1, an external resistance is coupled to the extra pin of the semiconductor device to provide impedance control so that the semiconductor device can have a desired output impedance value within a specification of about 35–70 ohms. Referring to FIG. 1, initially, an exterior resistance RZQ for a matching (which has a resistance value by about five times the impedance value of an external equipment) is connected between an extra pad ZQPAD of the impedance detector 10 and a ground. The impedance ZQ detector 10, which comprises an architecture as shown in FIG. 6, outputs the pad voltage ZQPAD and reference voltage REFIO.

Figure 6:
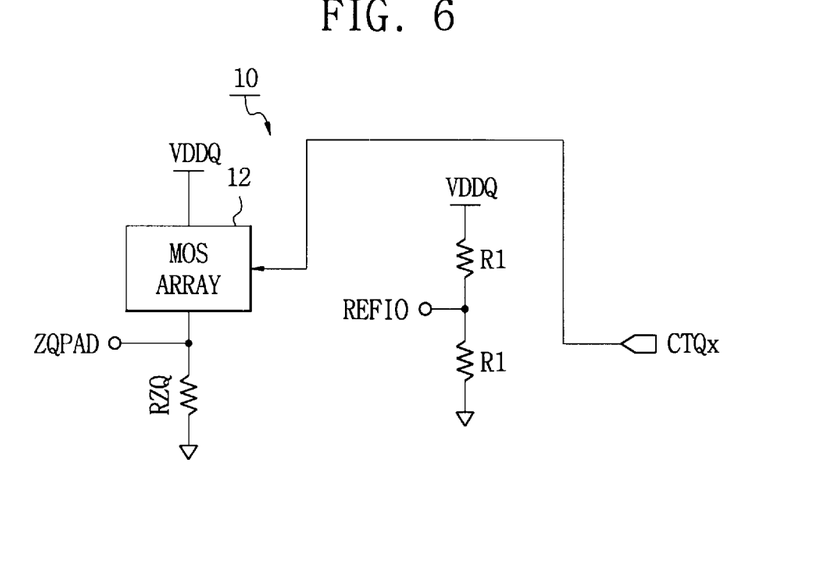
FIG. 6 is a diagram of an impedance detector shown in FIG. 1.

Referring to FIGS. 1 and 6, the reference voltage REFIO level is half the output power voltage level (i.e., VDDQ/2). The impedance comparator 20 compares levels of the reference voltage REFIO and the pad voltage ZQPAD, and outputs an up or down control signal UDZQ as its comparison result. The counter 30 performs an up or down counting operation in response to the up or down control signal UDZQ, respectively, and outputs control code CTQx for selectively turning on or turning off a MOS array 12 (FIG. 6) comprising a plurality of MOS transistors. In particular, the counter 30 executes a counting operation for increasing or reducing the value of the control code CTQx. Based on the control code CTQx, corresponding MOS transistors within the MOS array 12 are turned on or off, thus the levels of the reference voltage REFIO and the pad voltage ZQPAD become similar. In this case, the levels of the reference voltage REFIO and the pad voltage ZQPAD become similar to a VDDQ/2 level, and a turn-on resistance value of the MOS array 12 and a resistance value of the exterior resistance RZQ become. mutual. The transistors within the off chip driver 70 are turned on, equally to such MOS transistor provided within the MOS array 12 that correspond to the turning-on state, to thereby match the output impedance with the external impedance (e.g., impedance of the interface). In other words, the construction of the MOS array within both the MOS array 12 and the off chip driver 70 is similar so that the same number of transistors within the off chip driver 70 are turned on in the MOS array 12 to obtain impedance matching. The functions of a high code selector 40, a ZQ driver 50 and a data output buffer 60 are performed based on such construction.

In particular, the high code selector 40 selects one of a plurality of high control codes CTQx in accordance with a procedure to perform impedance matching, and outputs the selected control code as a high control code CTQDx. The ZQ driver 50 generates a driving code CZQx in response to the selected control code CTQDx when the off chip driver 70 is in a high impedance state, and provides the driving code CZQx to the data output buffer 60. Thus, a renewed driving code CZQx is generated based on a change of the selected control code CTQDx.

The renewed driving code CZQx is applied to the data output buffer 60. In response, one of a plurality of buffer units within the data output buffer 60 corresponding to the driving code CZQx is enabled. The enabled unit buffer within the data output buffer 60 receives DLATB and DLAT as memory cell data and respectively generates pull-up output data DOUx and pull-down output data DODx, and outputs it to the off chip driver 70 so that the corresponding transistors within the MOS array are turned on. Therefore, the final output data is determined for a signal level by the selected (enabled) transistors within the off chip driver 70, and is output via an output terminal DQ. At this time, an output impedance value of such output data is similar to the impedance value of the exterior semiconductor device through the above-mentioned impedance control procedure so as to obtain impedance matching. Thus, the output data can be transmitted to an interface line without distortion since impedance matching prevents or mitigates reflection of the output signal.

Figure 2:
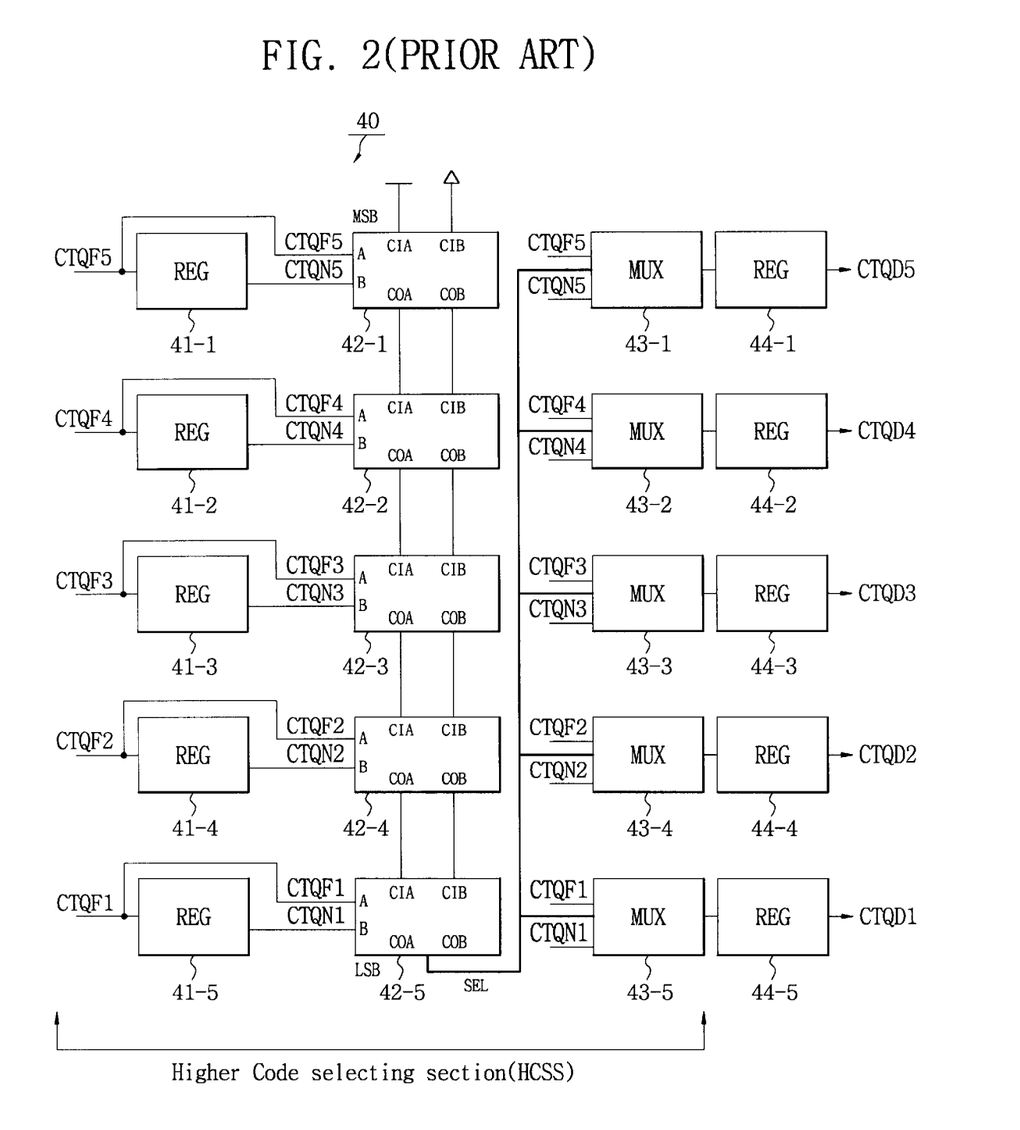
FIG. 2 illustrates a block diagram of a high code selector shown in FIG. 1.
Figure 3:
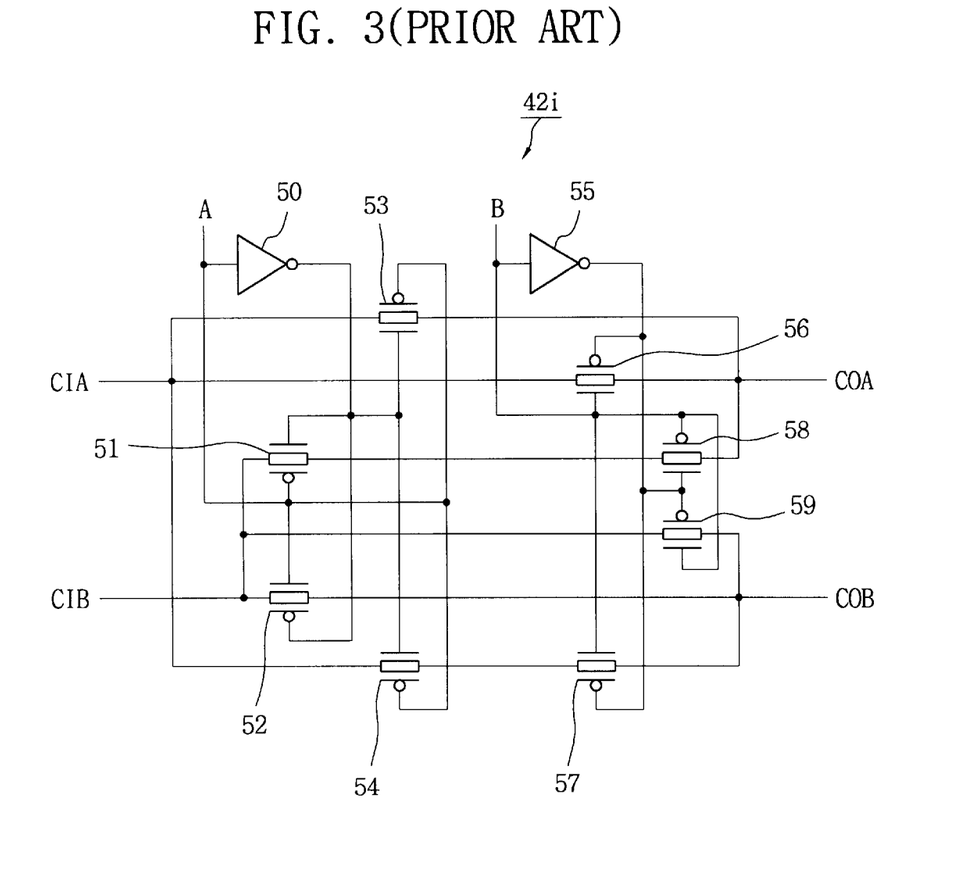
FIG. 3 is a detailed circuit diagram of a transmission gate comparing circuit shown in FIG. 2.
Figure 4:
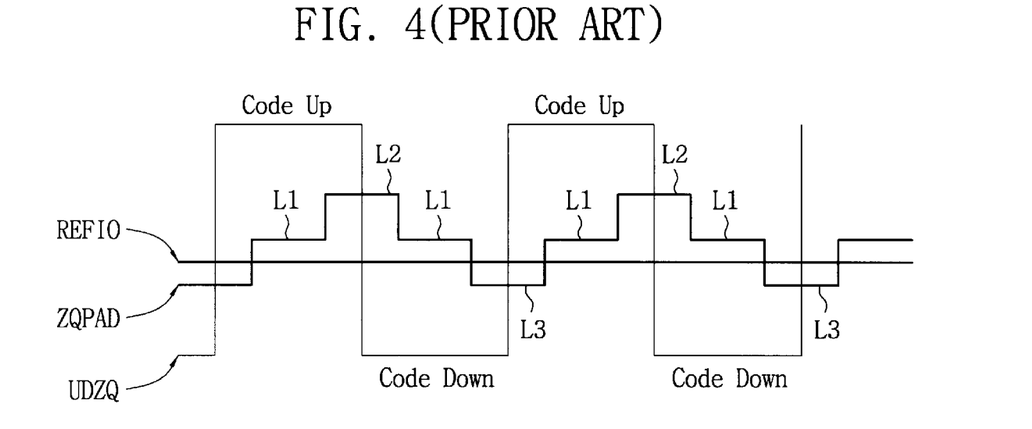
FIG. 4 is a diagram illustrating an example of a code vibration that occurs in the circuit of FIG. 1.

One problem associated with the above described impedance control system and method, however, is that it can be subject to turn-on impedance vibrations of the off chip driver 70 due to a vibration (or fluctuation) in the value of the high control code CTQDx output from the high code selector 40 during an impedance control operation. This problem will now be described with reference to FIGS. 2, 3 and 4. FIG. 2 is a detailed block diagram of the high code selector 40 shown in FIG. 1. FIG. 3 is a detailed block diagram of a transmission gate comparing circuit of FIG. 2. FIG. 4 is a drawing illustrating an example of the code vibration.

Referring to FIG. 2, the control code CTQx that is applied to the high code selector 40 comprises 5 bits, with each bit being stored, respectively, in registers 41-1, 41-2, 41-3, 41-4, 41-5. To differentiate between data applied in a current cycle from data applied in a previous cycle, the current control code CTQx is represented as CTQFx and the previous control code is represented as CTQNx. In other words, the previous cycle control code CTQNx comprises current control code CTQFx that was latched to the plurality of registers 41-1, 41-2, 41-3, 41-4, 41-5 in a previous cycle. When the reference voltage REFIO level and the pad voltage ZQPAD level become same (causing the counter 30 to perform a counting Operation to either increase or reduce the control code CTQx), the control code CTQx vibrates as two codes. In other words, two control codes CTQx having a difference of 1 bit become an output of the counter 30. Therefore, the high code selector 40 receives two control codes CTQFx, CTQNx for two cycles and selects higher control code through a plurality of transmission gate comparing circuits 42-1, 42-2, 42-3, 42-4, 42-5 and multiplexers 43-1, 43-2, 43-3, 43-4, 43-5. Output data selected by the high code selector 40 is outputted as the high control code CTQDx having one constant code value through a plurality of output registers 44-1, 44-2, 44-3, 44-4, 44-5.

It has been determined, however, that the value of the high control code CTQDx output from the high code selector 40 can fluctuate due to a limitation caused in a comparison capability of the impedance comparator 20 (FIG. 1). In particular, the impedance comparator 20 comprises a differential amplifier for amplifying a difference between the reference voltage REFIO level and the pad voltage ZQPAD level. When the difference between the reference voltage REFIO level and the pad voltage ZQPAD level is smaller than maximum input voltage ($\Delta V$) of the differential amplifier, the up/down control signal UDZQ output from the comparator 20 is outputted as a signal that indicates a direction similar to the previous direction. For instance, referring to FIG. 4, level L2 represents a level value of ZQPAD that is sensed after a code value of the up/down control signal UDZQ changes state after the difference between the reference voltage REFIO level and the pad voltage ZQPAD level is sensed at level L1. In this case, the control code CTQx of the counter 30 vibrates as three code values that are derived by adding up all levels until L3, and in an outputting terminal of the high code selector 40 that receives such values, two high control codes CTQDx are alternately represented. That is, the high code selector 40 cannot output one constant code value, but outputs two vibrating high control code CTQDx, thus causing a vibration of the turn-on impedance of the off-chip driver 70. If the vibration of the impedance occurs, the problems associated with an impedance miss matching may occur such as difficulty in high-speed transmission of data and potential distortion of the output data. Accordingly, an improved impedance control system that overcomes such problems is highly desirable.

SUMMARY OF THE INVENTION

The present invention is directed to an impedance controlled output circuit of a semiconductor device having a mechanism for providing a stable output impedance so as to substantially obviates one or more of the above-described disadvantages associated with impedance miss matching.

A primary object of the present invention is to provide a semiconductor device (such as a semiconductor memory device) having a mechanism for providing a stable output impedance and controlling impedance matching.

Another object of the present invention is to provide a semiconductor memory device having a mechanism for preventing vibration of a turn-on impedance of an off chip driver.

A further object of the present invention is to provide an impedance controlled output circuit for outputting high control code of a high code selector as one constant code value, and provide an operating method thereof.

In one aspect of the present invention, a circuit for controlling the impedance for a semiconductor device comprises a control code selecting circuit comprising a plurality cascade-connected stages of code selecting sections, wherein the control code selecting circuit is configured for outputting a constant control code. The multi-stage high code selecting section is preferably connected between a counter and an impedance driver, and is configured for preventing vibration of the turn-on impedance of an off chip driver.

In another aspect, an impedance controlled output circuit for a semiconductor memory device comprises:

an impedance detector comprising a first transistor array responsive to a first control code to adjust the impedance of the first transistor array, a voltage divider, wherein the impedance detector outputs a reference voltage from the voltage divider and a pad voltage from a pad connected between an external resistance and the transistor array;

an impedance comparing circuit for comparing the reference voltage with the pad voltage and outputting a second control code in response thereto;

a counter for generating the first control code in response to the second control code to operate transistors within the first transistor corresponding to the second control code;

a high code selector comprising a plurality cascade-connected stages of code selecting sections, wherein the high code selecting sections in a given stage latch the first control code, compare the latched first control code with an unlatched first control code generated in a successive latch cycle and select the first control code having greater code value;

an impedance driver for generating buffer driving codes in response to the first control code selected in the high code selector;

a data output buffer comprising a plurality of output buffers that are selectively enabled based on each bit state of the buffer driving codes, wherein the data output buffer receives and buffers a pair of memory cell data through the enabled output buffers and outputs the memory cell data as pull-up and pull-down output data; and an off chip providing the output data impedance-matched through an output terminal.

In another aspect of the present invention, a method of selecting a high control code of an impedance controlled output circuit is provided wherein a multi-stage high code selecting circuit operatively connected between a counter and an impedance driver so as to prevent a vibration of a turn-on impedance of an off chip driver, and only highest control code among a plurality of control code outputted from the counter is extracted and processed by the multi-stage high code selecting circuit to output there from a high control code having one constant code value.

Advantageously, the present invention provides a mechanism to prevent the vibration of the turn-on impedance of the off chip driver (and thereby obtain a stabilized output impedance) during an impedance control operation to achieve a matched output impedance. The present invention can be implemented in conjunction with various semiconductor devices to obtain increased performance.

These and other aspects, features, and advantages of the present invention will become apparent from the following detailed description of the preferred embodiments, which is to be read in connection with the accompanying drawings.

DETAILED DESCRIPTION OF PREFERRED EMBODIMENTS

Figure 5:
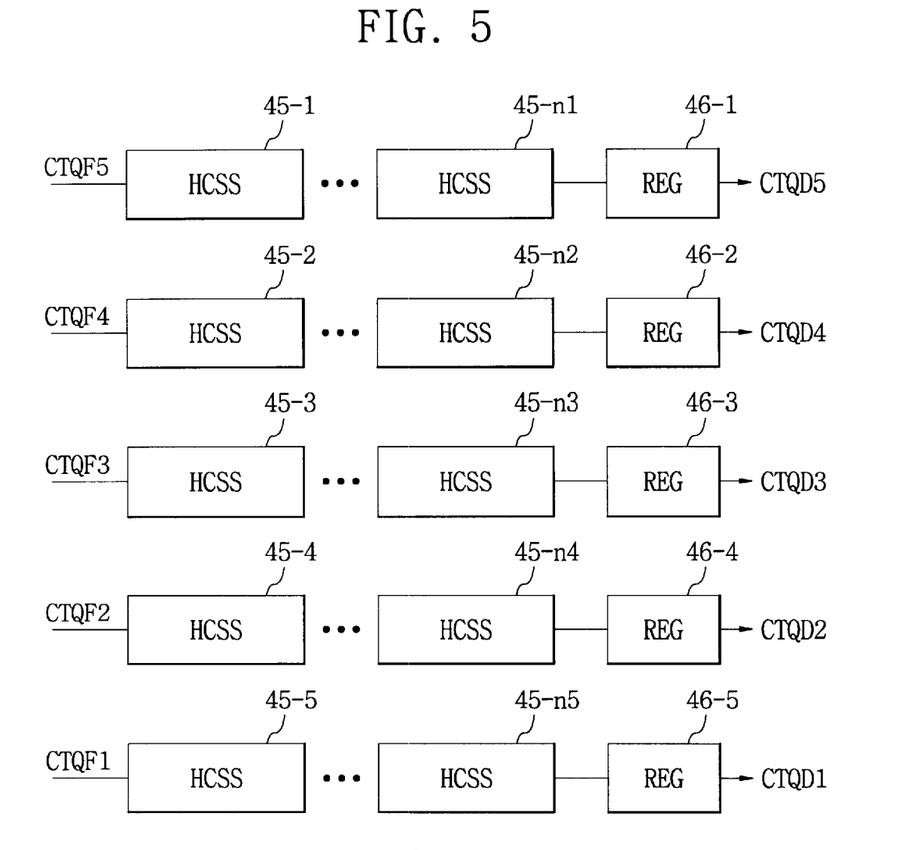
FIG. 5 is a block diagram of a high code selector according to an embodiment of the present invention.

A detailed discussion of preferred embodiments will now be provided with reference to the accompanying drawings, wherein components having the same or similar functions are labeled with the same or similar reference numbers. FIG. 5 is a block diagram of a high code selector according to an embodiment of the present invention. Preferably, the high code selector comprises a multi-stage construction so as to prevent fluctuation in the code value of the high control code CTQDx from being output. A plurality of cascade-connected high code selecting sections shown in FIG. 5, HCSS 45-x ~45-nx are preferably disposed between a counter 30 and an impedance driver 50 (of FIG. 1). Each high code selecting section HCSS comprises a register 41-x, a transmission gate comparing circuit 42-x and a multiplexer 43-x, as shown in FIG. 2. It is to be understood that the reference character "x" used herein represents a natural number of 1 or greater. FIG. 5 illustrates an embodiment wherein a control code CTQx comprises 5 bits (i.e., to obtain 32 code values), although it is to be understood that the number of bits used can vary based on the implementation.

It is to be understood that the high code selection section can comprise any number of stages n depending on the application. For purpose of illustration, as shown in FIG. 5, it the high code selecting section HCSS is constructed using two stages. Assuming the two stage construction, and that control code CTQx of the counter 30 vibrates as three code values, then two high control code CTQx are represented in an outputting terminal of a high code selecting section 45-x of the first stage. A high code selecting section 45-2x of the second stage, in turn, receives two high control code CTQx and outputs one high control code. An output register 46-x within a high code selector 40 outputs the high control code CTQDx having one constant code value. Therefore, a vibration of turn-on impedance of an off chip driver 70 is prevented.

For purposes of illustration, a detailed discussion of the operation of the multi-stage high code selecting section HCSS in conjunction with an impedance comparator 20, counter 30 and impedance driver 50 will now be provided. The high code selector 40 preferably comprises the multi-stage high code selecting section HCSS and the output register 46-x (wherein one high code selecting section HCSS comprises a register 41-x, the transmission gate comparing circuit 42-x and the multiplexer 43-x as shown in FIG. 2.) and is configured to prevent code vibration. Preferably, each register 41-x is constructed using a CMOS clocked inverter and an inverter latch connected to an outputting terminal of the CMOS clocked inverter. In addition, each transmission gate comparing circuit 42-x comprises the architecture illustrated in FIG. 3. An output of the register 41-x (FIG. 2) is sent to a terminal B (FIG. 3) and corresponding bits of control code CTQF1~CTQF5 are respectively sent to the terminal A. A selection signal SEL (that indicates the result of a comparison according to first and second logics generated by inverters 50, 55) is generated by the operative connection of the inverters 50, 55 and numerous CMOS transmission gates 51–59. A detailed description of the operation of the circuit of FIG. 3 is disclosed in the Korean Patent Application No. 98-18021 domestically pre-applied by the present applicant of this invention on May 19, 1998, which is incorporated herein by reference. The multiplexer 43-x is preferably constructed by a CMOS transmission gate through which the control code is passed to a back stage in response to the selection signal SEL of the transmission gate comparing circuit 42-x. The CMOS,clocked inverter is preferably replaced by a connection construction of the CMOS transmission gate and the inverter. This transmission gate is often referred to as a multiplexer.

Figure 7:
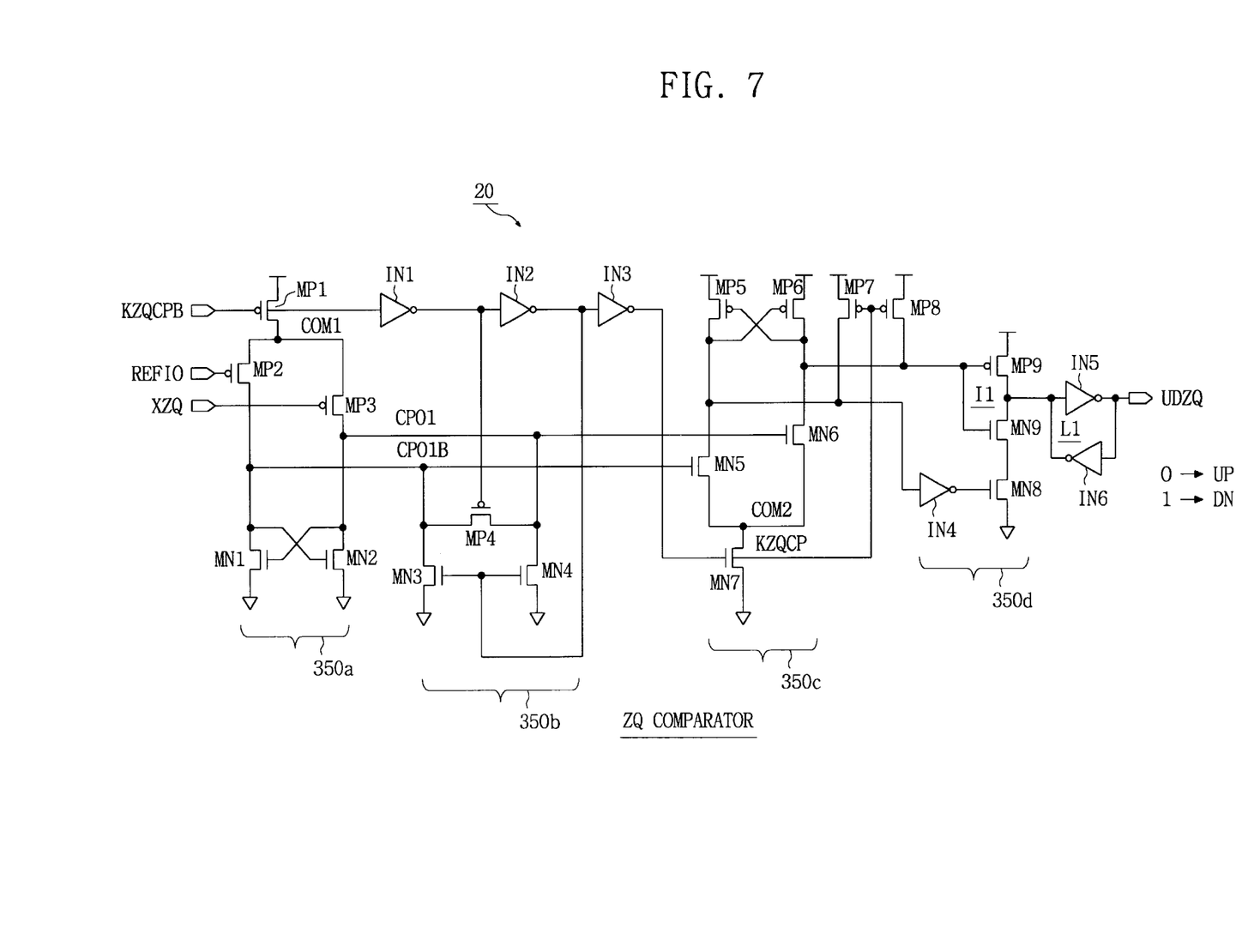
FIG. 7 is a circuit diagram of an impedance comparator according to an embodiment of the present invention.

FIG. 7 illustrates a circuit of an impedance comparator according to an embodiment of the present invention. The comparator 20 comprises a P-channel input type cross-coupled differential amplifier 350a comprising P-channel MOS transistors MP2, MP3 and N-channel MOS transistors MN1, MN2. The differential amplifier 350a amplifies the differential voltage between reference voltage REFIO and pad voltage XZQ. The comparator 20 further comprises an N-channel input type cross-coupled differential amplifier 350c comprising P-channel MOS transistors MP5, MP6 and N-channel MOS transistors MN5, MN6. The differential amplifier 350c amplifies the differential voltage between the output voltages CPO1 and CPO1B which are respectively represented on a pair of output lines of the P-channel input type cross coupled differential amplifier 350a. The comparator further comprises an output inverter 350d comprising P-channel and N-channel MOS transistors MP9, MN9, for inverting the output voltage represented on one side output line of the N-channel input type cross coupled differential amplifier 350c and outputting level-determined output voltage. An inverter latch L1 outputs a result gained by inverting an output of the output inverter 350d, as an up/down control signal UDZQ, and for continuously latching the inverting results until an output state of the output inverter becomes transit. Further, the comparator comprises a precharge and equivalent section 350b comprising P-channel and N-channel MOS transistors MP4, MN3, MN4.

Figure 8:
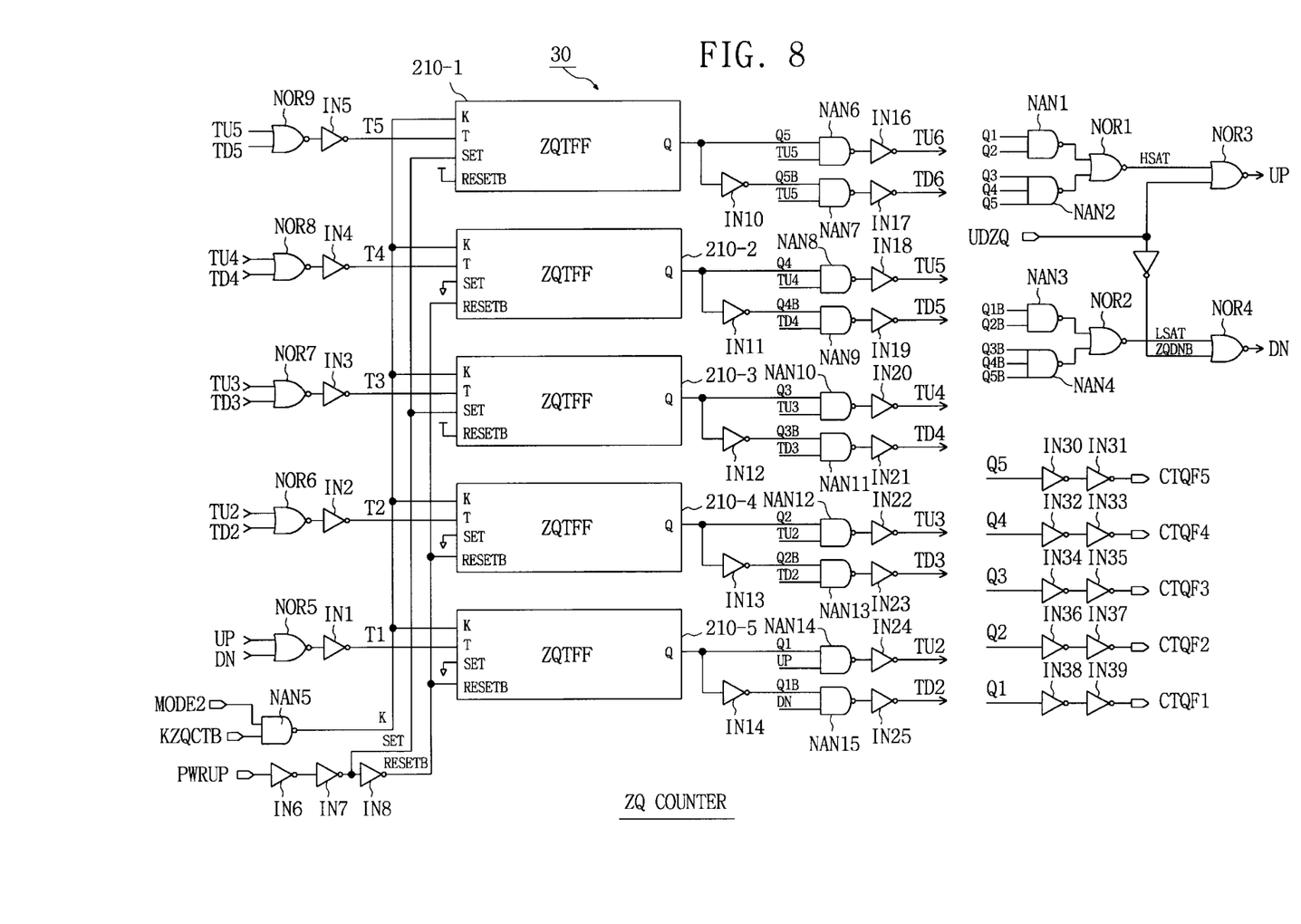
FIG. 8 is a circuit diagram of a counter according to an embodiment of the present invention.

FIG. 8 is a circuit diagram of a counter 30 according to an embodiment of the present invention. The counter 30 comprises a logic combination section which comprises a plurality of logic gates NAN1, NAN2, NAN3, NAN4, NOR1, NOR2, NOR3, NOR4, for logically combining the up/down control signal UDZQ that is received from the impedance comparator 20 and a first control code generated in a previous cycle to thereby generate an up/down counting signal. The counter 30 further comprises a plurality of T-type flipflops 210-1~210-5, connected in series with one another, for receiving the up/down counting signal UP, DN of the logic combination section through a trigger inputting terminal T so as to perform an up/down counting and for outputting the first control code as its counting result to each counting outputting terminal.

Figure 9:
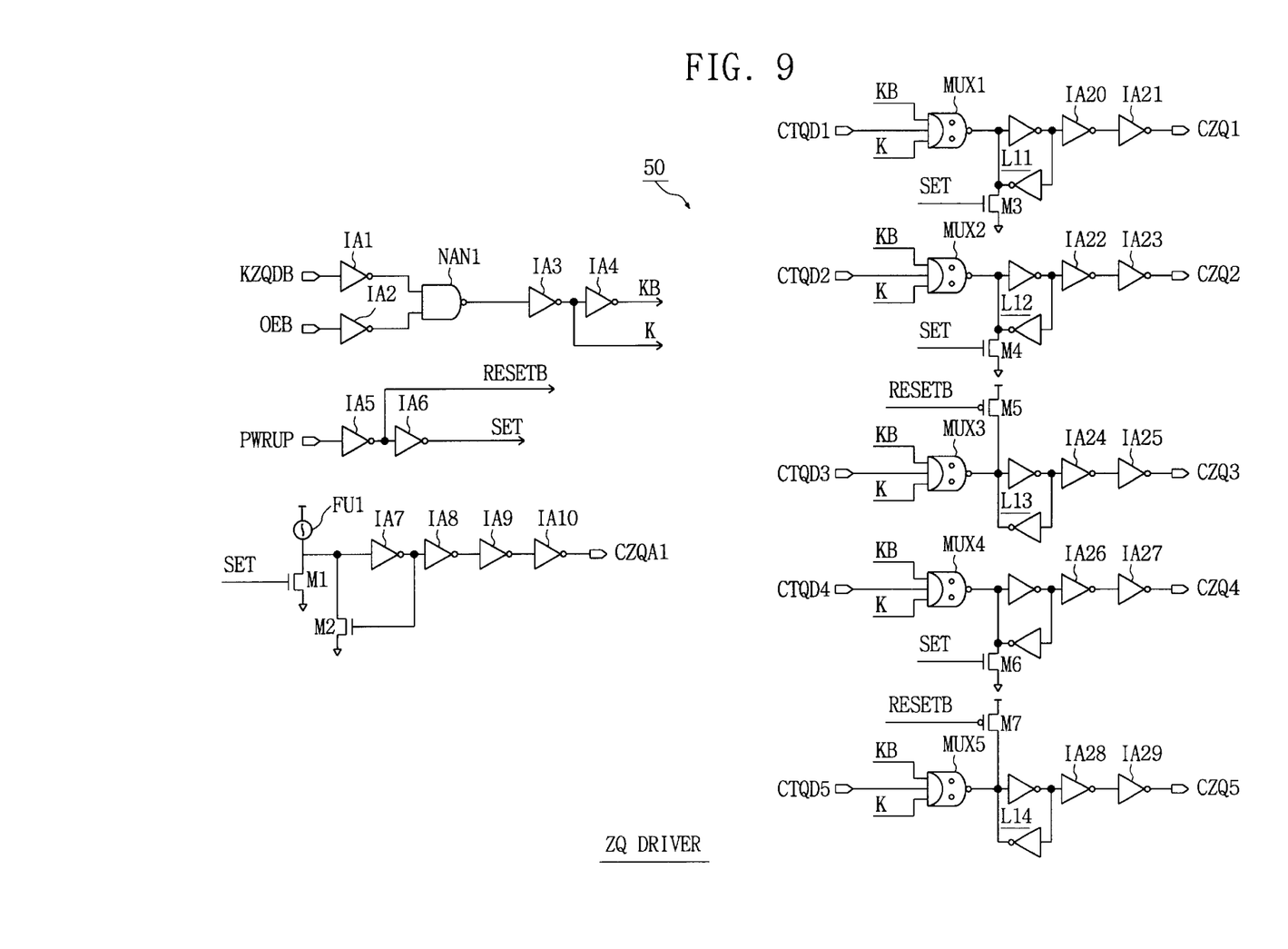
FIG. 9 is a circuit diagram of an impedance driver according to an embodiment of the present invention.

FIG. 9 is a circuit diagram of the impedance driver 50 according to an embodiment of the present invention. To generate normal buffer driving codes CZQ1~CZQ5, in response to control code CTQD1~CTQD5 selected in the high code selector 40, the impedance driver 50 comprises a transmitting section MUX1~MUX5 for transmitting the control code CTQD1~CTQD5 outputted from the high code selector by a combination signal KB, K that is gained by logically combining an output enable bar signal OEB and a driver control clock KZQDB. A latch outputting section L11~L14 is included for latching and outputting an output of the transmitting section MUX1~MUX5 and generating the normal buffer driving codes. In addition, the driver 50 may comprise numerous inverters IA1~IA10,IA20~IA29, a fuse FU1, and NMOS transistors M1,M2.

The off chip driver 70 has a transistor array in which a plurality of transistors are arrayed in a symmetrical structure. The transistors within the array correspond to different output data states based on respective transistors being enabled to thereby generate output data that is impedance-matched to an array common node and output via an output pad DQ connected to the array common node. The term of an "off chip driver" is also used in U.S. Pat. No. 5,440,258 to Galbi et al., this term is used in the present invention without a specific definition, with a reference for its function and concrete operation within the semiconductor device.

An operation of the high code selecting section HCSS according to one aspect of the present invention using the impedance control circuit having such a structure will now be described. Assuming that the up/down control signal UDZQ output from the comparator 20 indicates a direction that is the same as the previous direction, if the difference between the reference voltage REFIO level and the pad voltage ZQPAD level is smaller than maximum input voltage $\Delta V$ of the differential amplifier shown in FIG. 3, the control code CTQx of the counter 30 is outputted as three code values through three cycles.

The control code outputted in a first cycle is latched to the register 41-x and is then outputted as CTQNx in a second cycle. The control code that is output in the second cycle is provided as CTQFx to the inputting terminal A of the transmission gate comparing part 42-x. The control code CTQNx of the first cycle and the control code CTQFx of the second cycle are primarily compared by the high code selecting section 45-x of a first stage shown in FIG. 5, and the control code having a higher code value is output. Subsequently, control code CTQFx that is output in a third cycle is compared with the control code CTQFx of the second cycle, latched to the register 41-x by the high code selecting section 45-x of the first stage and then output. Further, the control code having a higher code value is output. That is, two high control codes CTQx having mutually different values are represented in the outputting terminal of the high code selecting section 45-x of the first stage.

Therefore, the high code selecting sections 45-2x of the second stage receive two high control code CTQx that are output from the high code selecting sections 45-x of the first stage and, in turn, output one high control code. Thus, the output registers 46-x within the high code selector 40 output the higher control code as a final determination value when a level of the pad voltage XZQ crosses a predetermined level of the reference voltage REFIO. Herewith, the final determination value is the highest control code CTQDx having one constant code value.

Advantageously, since the high code selector 40 outputs one constant code value as the high control code, vibration of the turn-on impedance of the off chip driver is prevented. Accordingly, the problems associated with impedance miss matching can be eliminated. Indeed, the mechanism for preventing a vibration of turn-on impedance of an off chip driver can be implemented in any semiconductor device or semiconductor memory device such as a static RAM, etc. The present invention advantageously provides a mechanism for obtaining a desired output impedance regardless of a change of power voltage and an operating temperature even though its change occurs. Accordingly, the present invention provides a significant improvement in the performance of an output operation of a semiconductor memory device.

Although illustrative embodiments have been described herein with reference to the accompanying drawings, it is to be understood that the present system and method is not limited to those precise embodiments, and that various other changes and modifications may be affected therein by one skilled in the art without departing from the scope and spirit of the invention. Indeed, it will be apparent to those skilled in the art that various controls and variations can be made in the present invention without deviating from the spirit or scope of the invention. For instance, the construction of a high code selecting section according to the present invention may be modified, or the high code selecting section may be replaced by another circuit device having the same or similar function. Further, a mechanism for selecting a lower code instead of a high code can also be employed. It is to be understood that all such changes and modifications are intended to be included within the scope of the invention as defined by the appended claims.

What is claimed is:

1. A circuit for controlling impedance in a semiconductor device, the circuit comprising a control code selecting circuit comprising a plurality cascade-connected stages of code selecting sections, wherein the control code selecting circuit is configured between a counter and a impedance driver for outputting a constant control code.

2. The circuit of claim 1, wherein each code selecting section comprises:

a register for latching a respective portion of the control code provided from a counter;

a transmission gate comparing circuit for comparing the latched control code with the control code provided from the counter and for outputting a selection signal; and a multiplexer for outputting a higher control code of two control codes as a high control code in response to the selection signal of the transmission gate comparing circuit.

3. The circuit of claim 2, wherein the register comprises a CMOS clocked inverter and an inverter latch operatively connected to an output terminal of the CMOS clocked inverter.

4. The circuit of claim 2, wherein the transmission gate comparing circuit comprises a 1-bit transmission gate comparator comprising a plurality of pass gates.

5. An impedance controlled output circuit for a semiconductor memory device, the circuit comprising:

an impedance detector comprising a first transistor array responsive to a first control code to adjust the impedance of the first transistor array, a voltage divider, wherein the impedance detector outputs a reference voltage from the voltage divider and a pad voltage from a pad connected between an external resistance and the transistor array;

an impedance comparing circuit for comparing the reference voltage with the pad voltage and outputting a second control code in response thereto;

a counter for generating the first control code in response to the second control code to operate transistors within the. first transistor corresponding to the second control code;

a high code selector comprising a plurality cascade-connected stages of code selecting sections, wherein the high code selecting sections in a given stage latch the first control code, compare the latched first control code with an unlatched first control code generated in a successive latch cycle and select the first control code having greater code value;

an impedance driver for generating buffer driving codes in response to the first control code selected in the high code selector;

a data output buffer comprising a plurality of output buffers that are selectively enabled based on each bit state of the buffer driving codes, wherein the data output buffer receives and buffers a pair of memory cell data through the enabled output buffers and outputs the memory cell data as pull-up and pull-down output data; and an off chip providing the output data impedance-matched through an output terminal.

6. The circuit of claim 5, wherein a resistance value of the external resistance is approximately five times of a resistance value of an external data transmission line.

7. The circuit of claim 5, wherein the reference voltage is approximately one-half of an operating voltage.

8. The circuit of claim 5, wherein each high code selecting section comprises:

a register for latching the first control code generated by the counter;

a transmission gate comparing circuit for comparing the latched first control code and the unlatched first control code, and outputting a selection signal; and a multiplexer for outputting the first control code among the latched and unlatched first control code as high control code in response to the selection signal.

9. The circuit of claim 5, wherein the impedance comparing circuit comprises:

a first differential amplifier for amplifying a voltage differential between first reference voltage and the pad voltage;

a second differential amplifier for amplifying a voltage. differential between a pair of voltages output from the first differential amplifier;

an output inverter for inverting an output voltage of the second differential amplifier and outputting level-determined output voltage; and an inverter latch for inverting an output of the output inverter and generating the second control signal, wherein the inverting results are continuously latched until an output state of the output inverter becomes transit.

10. The circuit of claim 9, wherein the first differential amplifier of the impedance comparing circuit comprises a P-channel input type cross-coupled differential amplifier and the second differential amplifier comprises an N-channel input type cross coupled differential amplifier.

11. The circuit of claim 5, wherein said counting circuit comprises a logic combining circuit for logically combining the second control code and the first control code generated in a previous cycle and generate a second control code; and a plurality of T-type flipflops connected by series with one another, for receiving the second control code output from the logic combining circuit through a trigger inputting terminal, performing a counting operation, and outputting the first control code as a result of the counting operation to each counting outputting terminal.

12. A control circuit in a programmable impedance control circuit for controlling a turn-on impedance in an off chip driver of a semiconductor device, said control circuit comprising a plurality of lower code selecting sections that are cascade-connected in at least two stages between a counter and an impedance driver, wherein said lower code selecting section comprises:

a register for latching a control code provided from the counter;

a transmission gate comparing circuit for comparing the latched control code and an unlatched control code provided from the counter, and outputting a selection signal; and a multiplexer for outputting one of the latched and unlatched control having the lower value in response to the selection signal.

13. The circuit of claim 12, further comprising a register for latching the lower control code outputted from the multiplexer and applying it to the impedance driver in response to an output enable clock.

14. A method for controlling impedance in a semiconductor device, comprising the steps of:

processing impedance control code in a plurality of stages of a code selection circuit configured between a counter and an impedance driver; and selecting for output from a final stage of the code selection circuit, a processed control code having a constant code value.

15. The method of claim 14, wherein the step of selecting comprises selecting a processed impedance control code having a highest value from among a plurality of impedance control codes input to the code selection circuit in a plurality of successive cycles.

16. The method of claim 14, wherein the step of selecting comprises selecting a processed control code having a lowest value from among a plurality of impedance control codes input to the code selection circuit in a plurality of successive cycles.

17. The method of claim 14, wherein the step of processing comprises comparing a control code received in a current control cycle with a latched control code received in a previous cycle.

18. The method of claim 14, wherein the step of processing comprising processing the impedance control code in two stages.

19. The method of claim 14, wherein the method is implemented for preventing fluctuation of the turn-on impedance of an off chip driver circuit.

20. The method of claim 14, wherein the method is implemented for matching the output impedance of the semiconductor device to the impedance of a transmission line.

* * * * *